United States Patent
Erzhuang et al.

[19]

[11] Patent Number: 5,918,152

[45] Date of Patent: Jun. 29, 1999

[54] GAP FILLING METHOD USING HIGH PRESSURE

[75] Inventors: Liu Erzhuang; Charles Lin; Yih-Shung Lin, all of Singapore, Singapore

[73] Assignee: Chartered Semiconductor Manufacturing, Ltd., Singapore, Singapore

[21] Appl. No.: 08/933,368

[22] Filed: Sep. 19, 1997

[51] Int. Cl.[6] ........................ H01L 21/4763; H01L 21/31; H01L 21/469

[52] U.S. Cl. ..................... 438/782; 438/760; 438/761; 438/778; 438/632

[58] Field of Search ............................ 438/760, 782, 438/428, 436, 438, 632

[56] References Cited

U.S. PATENT DOCUMENTS

| | | | |
|---|---|---|---|
| 5,435,888 | 7/1995 | Kalnitsky et al. | 216/18 |
| 5,554,567 | 9/1996 | Wang | 438/624 |
| 5,567,660 | 10/1996 | Chen et al. | 437/231 |
| 5,834,339 | 11/1998 | Distefano | 438/125 |
| 5,837,618 | 11/1998 | Avanzino | 438/778 |

*Primary Examiner*—Charles Bowers
*Assistant Examiner*—Nema Berezny
*Attorney, Agent, or Firm*—George O. Saile; Stephen B. Ackerman

[57] ABSTRACT

A method is described for filling narrow gaps in a surface that is being overcoated. This has been achieved by heating the overcoating layer to a sufficient extent so that it flows relatively easily. This, in combination with externally applied pressure, causes the overcoating layer to effectively fill any narrow gaps in the surface being coated. Temperature and pressure are applied for a time that is sufficient to allow small quantities of gas that may have become trapped in the gaps to bubble to the surface. In an alternative embodiment, the surface to be coated is subjected to negative pressure prior to application of the coating. This eliminates the possibility of trapping gas in the gaps so a waiting time is no longer necessary.

16 Claims, 2 Drawing Sheets

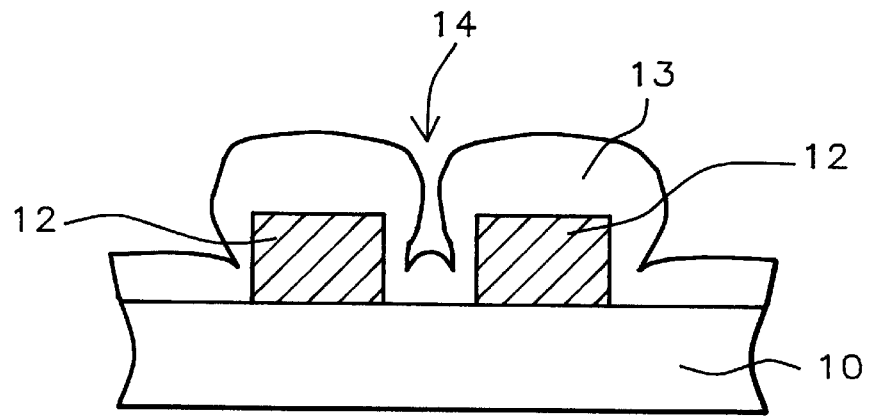
FIG. 1 - Prior Art
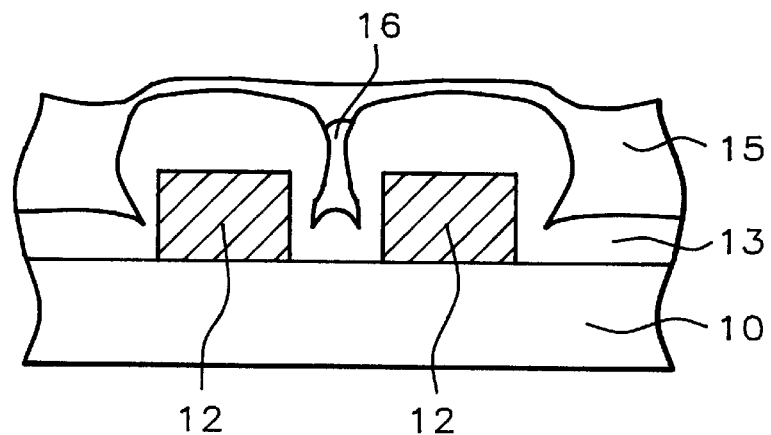
FIG. 2 - Prior Art

GAP FILLING METHOD USING HIGH PRESSURE

BACKGROUND OF THE INVENTION (1). Field of the Invention

The invention relates to the general field of semiconductor integrated circuits with particular reference to planarization techniques.

(2). Description of the Prior Art

FIG. 1 shows a schematic view of a portion of a partially completed integrated circuit. Lying on substrate 10, which could be a silicon substrate or a dielectric layer such as field oxide or BPSG (boro-phospho-silicate glass), are two metal lines 12 which run in a direction normal to the plane of the figure. An IMD (inter-metal dielectric) layer 13 has been deposited over lines 12 in preparation for forming the next level of wiring. Because lines 12 are relatively close together, narrow gap 14 has been left in the top surface of 13. On average, the width of such a gap would be between about 0.03 and 0.5 microns.

Referring now to FIG. 2, planarizing layer 15, typically SOG (spin-on glass) has been deposited over layer 13. As shown, gap 14 (of FIG. 1) has been partially filled in but a large pocket of gas 16 has become trapped between layers 13 and 15. This is a situation to be avoided because a subsequent etchback process could remove the top SOG layer to open up a new gap which, in later oxide deposition steps, results in a rough surface topology. This, in turn, can give rise to metal filaments. It is therefore important to be able to fully fill gap 14 and not leave any trapped gas behind.

A number of ways of improving the filling of narrow gaps have been proposed in the prior art. For example, Kalnitsky et al. (U.S. Pat. No. 5,435,888 July 1995) apply a very thin layer of SOG that is able to flow into (and presumably fill) narrow gaps. This is followed by a layer of CVD deposited oxide (such as TEOS) and, finally, by a second layer of SOG which is also thin.

Chen et al. (U.S. Pat. No. 5,567,660 October 1996) apply SOG to a stationary wafer. The wafer is then caused to spin relatively slowly, just enough to make it begin to spread out over the surface. Once the surface is evenly covered, the spinning speed is increased. By this time the SOG viscosity has increased somewhat (due to drying) so the overall thickness of the SOG coating is not affected by the increased spinning rate. However, the centrifugal force associated with the higher speed spin causes the SOG to better fill in the gaps.

Wang (U.S. Pat. No. 5,554,567 September 1996) improves the adhesion of a SOG layer by providing a short heat treatment, in vacuo, after the SOG has been cured. A second layer of SOG is then deposited without breaking vacuum.

The present invention teaches a method (for fully filling gaps such as 14 in FIG. 1) which is quite different from those described above but which is highly effective and easy to implement.

SUMMARY OF THE INVENTION

It has been an object of the present invention to provide a method which enables a narrow gap in a surface that is overcoated with a layer of a flowable material to be fully filled.

Another object of the present invention has been that said method be easy to use.

A still further object of the present invention has been that the application of said method allow current materials and processes to be extended to finer geometries.

These objects have been achieved by heating the overcoating layer to a sufficient extent to render it relatively limpid. This, in combination with externally applied pressure, causes the overcoating layer to effectively fill any narrow gaps in the surface being coated. Temperature and pressure are applied for a time that is sufficient to allow small quantities of gas that may have become trapped in the gaps to bubble to the surface. In an alternative embodiment, the surface to be coated is subjected to negative pressure prior to application of the coating. This eliminates the possibility of trapping gas in the gaps so a waiting time is no longer necessary.

BRIEF DESCRIPTION OF THE DRAWINGS

FIGS. 1 and 2 illustrate how, in the prior art, a narrow gap present in a surface does not get fully filled when a second layer is laid down over it.

DESCRIPTION OF THE PREFERRED EMBODIMENTS

Figure 3:
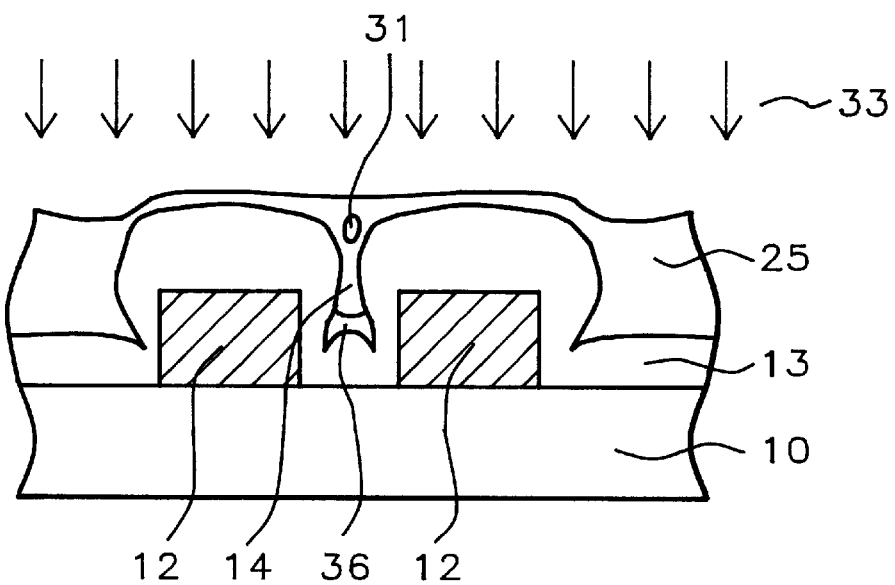
FIG. 3 illustrates a first embodiment of the present invention wherein filling of a surface gap is enhanced by the use of externally applied pressure.

Referring now to FIG. 3, as in FIG. 1, a schematic view of a portion of a partially completed integrated circuit is seen. Lying on substrate 10, which could be a silicon substrate or a dielectric layer such as field oxide or BPSG (boro-phosphosilicate glass), are two metal lines 12 which run in a direction normal to the plane of the figure. An IMD (inter-metal dielectric) layer 13 has been deposited over lines 12 in preparation for forming the next level of wiring. Because lines 12 are relatively close together, narrow gap 14 has been left in the top surface of 13. On average, the width of such a gap would be between about 0.03 and 0.5 microns.

The top surface of 13 has been coated with layer 25 of a flowable material, such as SOG or polyimide commonly, but not necessarily, for the purpose of planarizing the surface. Coating may be accomplished by any of several methods, including spin-coating and spraying. Before, during, or after coating (depending on the application), the assemblage, including layer 25, is heated to a temperature that is sufficient to cause layer 25 to become a liquid with a viscosity between about 1 and 1,000 poise.

While layer 25 (now liquid) is at this temperature, a positive pressure (symbolized by arrows 33) is applied and maintained for a period of time that is sufficient to cause liquid 25 to fully fill narrow gap 14. This period of time is needed because there is still the possibility that some gas (marked as 36 in FIG. 3) will get trapped between 25 and 13. By retaining the applied pressure on relatively low viscosity liquid 25 bubbles of the trapped gas (such as 31) will have time to rise to the surface of 25 and be thereby removed.

If layer 25 is SOG, a temperature between about 150 and 400° C. in combination with a pressure between about 2 and 50 atmospheres and a time period between about 0.1 and 10 minutes has been found to work well.

Once layer 25 has been maintained at the required temperature and pressure for the required time, the temperature of and the pressure on liquid 25 are returned to room temperature and atmospheric pressure, respectively.

Figure 4:
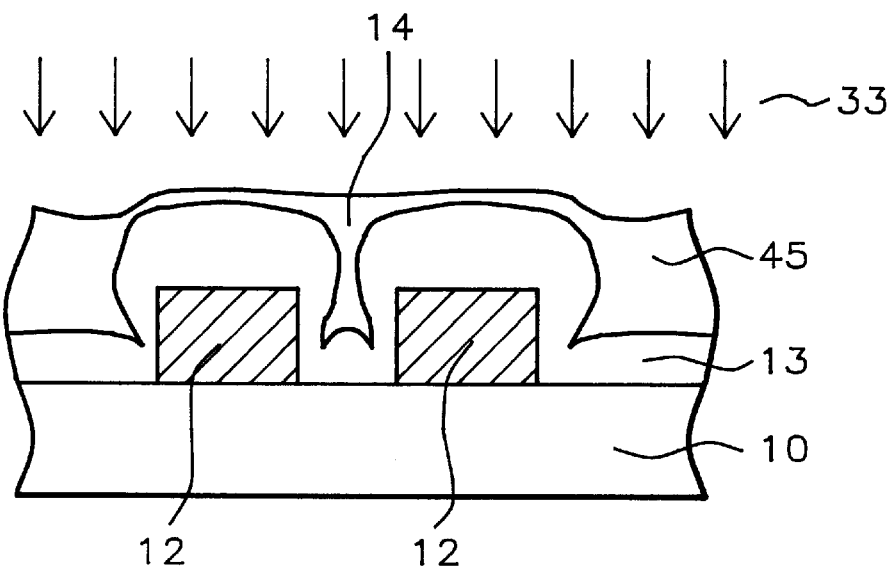
FIG. 4 illustrates a second embodiment of the present invention wherein filling of a surface gap is enhanced by using a combination of positive and negative pressures.

We refer now to FIG. 4. In an alternative embodiment of the present invention, the atmosphere normally surrounding layer 13 is removed. That is, layer 13 is subjected to a negative (less than atmospheric) pressure. We have preferred a pressure of about 1 torr but any pressure between about 0.1 and 500 torr would still work. As in the first embodiment, layer 45 is a flowable material, such as SOG, commonly, but not necessarily, applied for the purpose of planarizing the surface. Coating may be accomplished by any of several methods, including spin-coating and spraying, but the negative pressure must be applied before coating begins.

Before, during, or after coating (depending on the application), the assemblage, including layer 45, is heated to a temperature that is sufficient to cause layer 45 to become a liquid with a viscosity between about 1 and 1,000 poise. While layer 45 (now liquid) is at this temperature, a positive pressure (symbolized by arrows 33) is applied. Because of the negative pressure surrounding 13, little or no gas gets trapped inside gap 14 so the system may be restored to room temperature and atmospheric pressure as soon as the desired thickness of layer 45 (typically between about 0.03 and 0.5 microns) has been laid down.

If layer 45 is SOG, a temperature between about 150 and 400° C. in combination with a pressure between about 2 and 50 atmospheres has been found to work well.

While the invention has been particularly shown and described with reference to the preferred embodiments thereof, it will be understood by those skilled in the art that various changes in form and details may be made without departing from the spirit and scope of the invention.

What is claimed is:

1. A method of coating an irregular surface whereby narrow gaps, having a width, get fully filled, comprising:

coating the surface with a layer of a flowable material, said material being at a temperature that causes it to be a liquid that has a viscosity between 1 and 1,000 poise;

while the liquid is at said temperature, subjecting said liquid to a positive pressure;

maintaining said temperature and pressure for a period of time, thereby causing the liquid to fully fill said narrow gaps; and then reducing the temperature of and pressure on the liquid to room temperature and atmospheric pressure, respectively.

2. The method of claim 1 wherein the step of coating the surface is achieved using spin coating or spraying.

3. The method of claim 1 wherein said irregular surface is the surface of a partially processed integrated circuit.

4. The method of claim 1 wherein the flowable material is spin-on glass or polyimide.

5. The method of claim 4 wherein said temperature is between about 150 and 400° C.

6. The method of claim 4 wherein said pressure is between about 2 and 50 atmospheres.

7. The method of claim 1 wherein said period of time is between about 0.1 and 10 minutes.

8. The method of claim 1 wherein said gap width is between about 0.03 and 0.5 microns.

9. A method of coating an irregular surface whereby narrow gaps, having a width, get fully filled, comprising:

subjecting said surface to a negative pressure;

coating the surface with a layer of a flowable material, said material being at a temperature that causes it to be a liquid that has a viscosity between 1 and 1,000 poise;

while the liquid is at said temperature, subjecting said liquid to a positive pressure, thereby causing the liquid to fully fill said narrow gaps; and then reducing the temperature of and pressure on the liquid to room temperature and atmospheric pressure, respectively.

10. The method of claim 9 wherein the step of coating the surface is achieved using spin coating or spraying.

11. The method of claim 9 wherein said irregular surface is the surface of a partially processed integrated circuit.

12. The method of claim 9 wherein the flowable material is spin-on glass.

13. The method of claim 12 wherein said temperature is between about 150 and 400° C.

14. The method of claim 12 wherein said positive pressure is between about 2 and 50 atmospheres.

15. The method of claim 9 wherein said negative pressure is between about 0.1 and 500 torr.

16. The method of claim 9 wherein said gap width is between about 0.03 and 0.5 microns.

* * * * *